United States Patent [19]

Müller

[11] Patent Number: 4,820,055

[45] Date of Patent: Apr. 11, 1989

[54] APPARATUS FOR ADJUSTING A MASK WITH AT LEAST ONE ADJUSTMENT MARK RELATIVE TO A SEMI-CONDUCTOR WAFER PROVIDED WITH AT LEAST ONE LATTICE STRUCTURE

[75] Inventor: Karl-Heinz Müller, Berlin, Fed. Rep. of Germany

[73] Assignee: Siemens Aktiengesellschaft, Berlin and Munich, Fed. Rep. of Germany

[21] Appl. No.: 899,925

[22] Filed: Aug. 25, 1986

[30] Foreign Application Priority Data

Aug. 26, 1985 [DE] Fed. Rep. of Germany ....... 3530439

[51] Int. Cl.$^4$ .......................... G03F 9/00; H01L 21/68
[52] U.S. Cl. .................................... 356/401; 356/356; 356/363
[58] Field of Search ................ 356/400, 401, 356, 363

[56] References Cited

U.S. PATENT DOCUMENTS 4,211,489 7/1980 Kleinknecht et al. ............... 356/400
4,422,763 12/1983 Kleinknecht ........................ 356/356

FOREIGN PATENT DOCUMENTS 2022289A 6/1979 United Kingdom .

OTHER PUBLICATIONS

"Experimental Evaluation of Interferometric Alignment Techniques for Multiple Mask Registration", by T. M. Lyszczarz, *J. Vac. Sci. Technol.*, vol. 19, No. 4, Nov./Dec. 1981, pp. 1214-1218.

"Submicron Photolithography with 10:1 Projection Printing", by W. Arden, Siemens Forsch-u. Entwickl.-Ber., vol. 11, No. 4, 1982, pp. 169-1973.

*Primary Examiner*—Richard A. Rosenberger
*Attorney, Agent, or Firm*—Hill, Van Santen, Steadman & Simpson

[57] ABSTRACT

The present invention is directed to positioning a mask having an adjustment mark relative to a semi-conductor wafer being provided with at least one lattice structure and is concerned with keeping the area of the adjustment mark and mask as small as possible and providing an easy distinguishing of the direction of misalignment therebetween. The adjustment mark comprises at least two groups of gratings having different grid directions. In order to distinguish between misalignment which occurs in opposite directions, different grid spacings are provided. Preferably, the patterns are in strips and the adjustment mark comprises strips.

8 Claims, 5 Drawing Sheets

APPARATUS FOR ADJUSTING A MASK WITH AT LEAST ONE ADJUSTMENT MARK RELATIVE TO A SEMI-CONDUCTOR WAFER PROVIDED WITH AT LEAST ONE LATTICE STRUCTURE

BACKGROUND OF THE INVENTION

The present invention is directed to an apparatus for adjustment of a mask relative to a semi-conductor wafer provided with at least one lattice structure, said mask being provided with at least one adjustment mark. The lattice structure will have a grating having different grid directions so that light striking the grating will be diffracted in different directions and the adjustment mark on the mask is opaque to the laser light so that when it is centered on the lattice structure, a lattice structure is shielded from the light and most of the diffracted light will be eliminated.

In order to be able to economically manufacture the fine structures of integrated circuits in mass production, lithographic methods are generally employed. A simple shadow projection in the light optical area is thereby increasingly replaced by more involved methods. Until a few years ago, a very simple lithographic method, namely a 1:1 shadow projection of a mask onto a wafer covered with a resist in a wavelength range of around 400 nm, i.e. in the range of soft UV radiation could be applied for generating structural details of integrated circuits on the surface of a silicon wafer. This method was distinguished by low cost, high wafer throughput and an excellent process compatibility, but the resolution of this method could not keep pace with the demands of circuit technology. Diffraction and interference effects and, in particular, the formation of standing waves due to reflections in the layer structure of this circuit cause structural imprecisions which made an application of this method impossible under production conditions given component productions smaller than 4 $\mu$m. Although light-optical lithographic methods continue to be applied, these are based on the principle of imaging with the assistance of mirrors or lens optics. In the meantime, the structural region down to 1 $\mu$m could be made usable with these far more precise methods known under the optical wafer stepper The limit of resolution, however, is therefore not reached. Structures down to at least 0.5 $\mu$m can be governed with the optical wafer steppers under production conditions.

Given employment of a synchrotron radiation, the simple 1:1 shadow projection is possible down to the extreme sub-micron range, for example, below 0.5 $\mu$m, with the assistance of x-ray lithographic without thereby having to accept limitations in the structural resolution due to the refraction, due to interference, or due to inadequate depth of field. The synchrotron radiation, for example, the relativistic radiation emission of electrons, which circulates with nearly the speed of light in a storage ring and is held on a circular orbit by means of a magnetic deflection, considerably exceeds all other x-ray sources in intensity and parallelism.

Imaging principles of x-ray lithography is extremely simple. For example, parallel x-ray emissions in the usable wavelength region between 0.1 and 2 nm impinge a mutually adjusted arrangement composed of a mask to be imaged and a silicon wafer to be exposed. A gap of typically 50 $\mu$m in width, the so-called proximity spacing, is present between the mask and the wafer so that the mask and wafer do not touch one another. The exposure of the silicon wafer, similar to the exposure given an optical wafer steppers also occurs in a plurality of sub-steps in high resolution x-ray lithography, for example, in what is referred to as a "step and repeat" method. The size of the subfields, for example, the area which can be meaningfully structured with a single exposure step is defined by the processing conditioned length offset of the silicon wafer between the individual exposure steps. From today's point of view, the usable sub-field sizes even given high structural resolution lie at a few cm edge length because the image field of the objective lens, typically 1 cm$^2$, does not act as a limitation.

Even given the great simplicity of the imaging principles of x-ray lithography, however, considerable technological problems are still to be resolved before broader application is possible. One problematical area is the adjustment of the mask and wafer relative to one another. In the structural region around 0.5 $\mu$m, the required adjustment precision is at least 0.01 $\mu$m. Since there are efficient optical components for actually only this wavelength region and since the energy density of the emission of lasers which can be employed for adjustment is so high that work can be carried out with extremely small adjustment mark fields, understandably, it is not x-radiation but visible light which is employed for the adjustment procedure.

In a known apparatus, the adjustment of the mask and the wafer relative to one another occurs by means of an imaging in a reflected light microscope. The simultaneous observation of the marks on both the wafer as well as on the mask produces problems with respect to the depth of field.

In another known apparatus, the adjustment of mask and wafer relative to one another occurs by means of diffraction with an interference effect. Lattice structures, which are arranged both on the mask as well as on the wafer, yield intensity modifications of common diffraction orders given dislocations of the mask and wafer relative to one another. These intensity modifications will occur due to the dislocation of the mask and wafer relative to one another; however, they cannot be separated from intensity modifications which occur due to fluctuations of the distance between the mask and wafer which intensity changes are of the same strength.

In another known apparatus, the adjustment of the mask and wafer relative to one another occurs by means of diffraction with illumination effect. Lattice structures, which are arranged on the wafer are thereby illuminated with a "Frenel" cylindrical lens which is arranged in the mask. This method is susceptible to disruptions.

In U.S. Pat. Nos. 4,211,489 and 4,422,763, whose disclosures are incorporated by reference, an apparatus is disclosed in which the adjustment of the mask and wafer relative to one another occurs by means of diffraction with an obscuring or covering of the diffraction grating. Lattice structures, which are arranged on the wafer, are thereby covered by marks which are arranged on the mask so that the intensity of the reflected, diffracted light changes dependent on the mutual position of the mask and wafer relative to one another. Given this known apparatus for the adjustment of mask and wafer relative to one another by means of diffraction with a obscuring or covering effect, the lattice structure which has four lattices having four different lattice directions, is arranged on the wafer. An adjustment mark is arranged on the mask, the outside dimensions of this adjustment mark being slightly smaller than the outside dimensions of the lattice structure on the wafer. When the laser emission irradiates an adjustment mark situated on the mask and the lattice structure on the wafer, a diffraction image of a portion of the lattice structure, which portion is not covered by the adjustment mark, will occur.

SUMMARY OF THE INVENTION

The object of the present invention is to provide an arrangement for adjusting a mask relative to a semi-conductor wafer, wherein the area of the adjustment mark on the mask can be kept extremely small and the direction in which the misadjustment or misalignment is present can be unequivocally perceived.

To accomplish these objects, the present invention is directed to an improvement in an apparatus for adjusting a mask relative to a semi-conductor wafer provided with at least one lattice structure, said mask being provided with at least one adjustment mark, said lattice structure comprising gratings having different grid directions, said apparatus including means for imaging the mark on the lattice structure by directing a beam of light at the lattice structure and means for receiving a diffracted light pattern. The improvements are that the one lattice structure comprises at least two gratings having different grating directions, each of said two gratings having two sub-gratings with different grid spacings to provide discriminations of the misalignment which occurs in each of the opposite directions and said adjustment mark having at least one portion for each of the gratings, each portion being provided with two edges so that misalignment in opposite directions presents uncovered sub-gratings so that the marks will create acuted edges for the lattice structures of different grid spacings.

Given an apparatus of the invention, a pattern wherein a plurality of covering portions are employed for every direction, right, left, up, down, or, respectively, negative and positive x-directions, positive and negative y-directions in a two-dimensional Cartesian coordinate system are employed for the adjustment of the mask and wafer relative to one another. This adjustment occurs by means of diffraction with the covering or shading effect. As a result thereof, the area of the adjustment mark is exploited better and the intensity of the reflections of the diffracted light is increased.

In order to distinguish the directions left from right or negative from positive x-direction, and the directions up and down or positive from negative y-directions, different grid spacings are employed. As a result thereof, a cross-talk of the intensities of the diffracted light which would indicate the adjustment in various directions is prevented. In an apparatus of the invention, there is no cross-talk of intensities which indicates a misalignment or misadjustment towards the left and of intensities which indicate a misalignment towards the right, nor is there a cross-talk of intensities which indicate the misalignment towards the top and of intensities which indicate the misalignment towards the bottom.

The lattices or grid spacings which are of significance for indicating of the misalignment in opposite directions, lie in tight proximity next to one another. The lattices, which are of significance for the indication of misalignment in positive and negative x-directions, thus, lie in tight proximity next to one another. The lattices, which are of significance for an indication of the misalignment in a positive and negative y-direction, likewise, lies in tight proximity next to one another. Thus, lacquer influences and proximity influences can thereby be kept low.

Other features, advantages and embodiments of the invention will be readily apparent from the claims, specification and drawings.

BRIEF DESCRIPTION OF THE DRAWINGS

FIGS. 2-7 show lattice structures for the appertaining diffraction images in accordance with the prior art with FIG. 2 showing a lattice structure of the prior art.

FIGS. 8-13 show lattice structures with the diffraction images in accordance with the present invention with FIG. 8 showing a lattice structure of the present invention.

DESCRIPTION OF THE PREFERRED EMBODIMENTS

Figure 1:
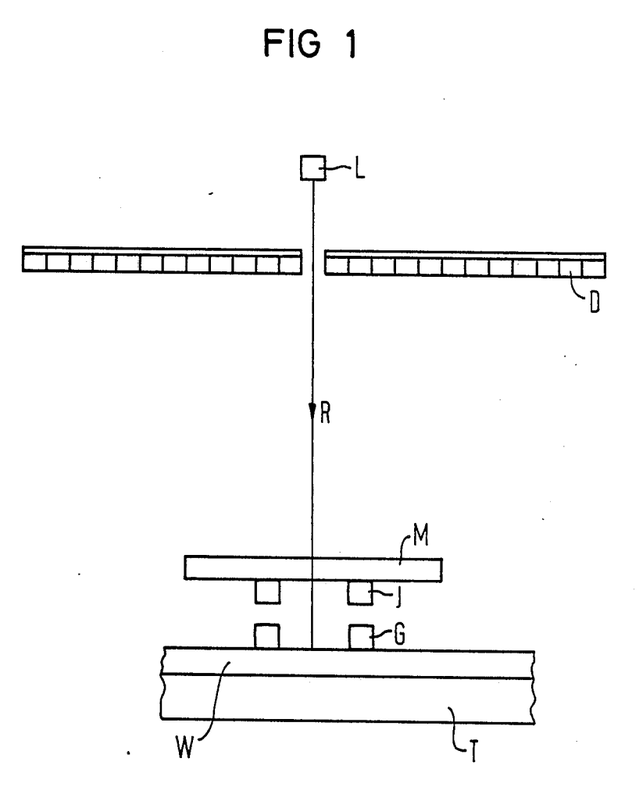
FIG. 1 schematically illustrates an apparatus of the present invention.

The principles of the present invention are particularly useful in the apparatus as schematically illustrated in FIG. 1. A silicon wafer W is located on an adjustment table T. A lattice structure G is situated on a surface of this wafer W. A mask M is situated above the wafer in a mask mount (not shown in the drawings). An adjustment mark J is arranged on an under surface of the mask M. The wafer W and the mask M exhibit a proximity spacing therebetween, for example of 30 to 100 μm. Laser light R is emitted from a laser L and impinges on a mask M so that the shape of the adjustment mark J is imaged onto the lattice structure G which is arranged on the surface of the wafer W. The adjustment marks J comprise a plurality of rectangles which are opaque for the light rays R and which have edges K, for example, at the long side of each of the rectangles. The laser light or the intensity of the diffracted light is documented as a function of the location in the detector arrangement comprising a detector array D.

It is also possible to provide means so that the adjustment mark J can be imaged on the lattice structure G with a demagnified image means. This will be arranged between the mask M and the wafer W.

The light rays are of the mono-chromatic light source L are directed onto a diffraction pattern G of the substrate W except by where the passage of light is blocked by the adjustment mark J of the mask M. As a result, light striking a portion of the diffraction pattern G will generate a pattern of light spots. The intensity of some of these light spots or of all of these light spots is identified. The measured intensity of the light spots can be balanced in a feedback circuit by relative motion between the adjustment mark J and the diffraction grating G. A repeater specimen stage T carrying the semi-conductor wafer W is used in order to execute a relative motion between the image of the mask M projected onto the semi-conductor wafer W and the semi-conductor wafer W itself. Photocells and servo motors can be employed in the feedback for aligning the mask M to those locations on the semi-conductor wafer W at which the components are to be manufactured on the semi-conductor wafer W. With the assistance of the feedback, the mask M can be aligned to the proper location of the semi-conductor member W in any case.

When the mask is a thin foil, for example, a foil of a few μm thick composed of a material, such as, for example, silicon, silicon compounds, boron nitride and when the adjustment mark J is composed of gold or tungsten, an apparatus of FIG. 1 can be employed for x-ray lithography. The thickness of the adjustment marks J should therefore lie between 0.3 and 1 μm.

The mask M is secured to a conventional mask table, which is not shown in the drawings and which is equipped with a servo motor for moving the mask M in both an x-direction and a y-direction.

Semi-conductor arrays, which are well known in measuring techniques, can be employed for the detector arrangement D. In addition, a bundle of fibers, which are coupled to a light conducting rod, can also be employed as the detector arrangement D. A video camera, can also be optically coupled to the light conducting rod. Such a system composed of fibers, light conducting rods and a video camera forms a location sensitive detector arrangement D just as does, for example, the semi-conductor array detector. What is important is that the diffracted light triggers adequate signal intensity when it impinges on the detector array D. Light conductors at that end at which the radiation to be detected is supposed to impinge can comprise a means for intensifying the light intensities, such as, for example, a film of material having a great luminescence, for example, a plastic scintillator. In addition, means for signal amplification can also be arranged between the light conducting rod and video camera.

Figure 2:
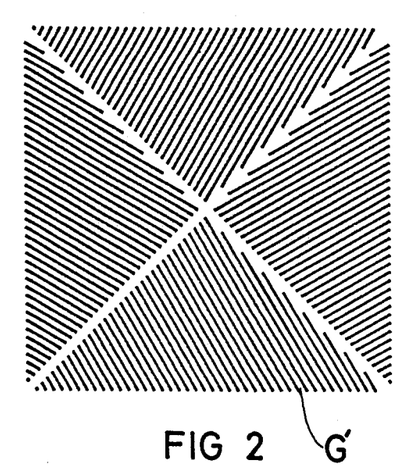

Lattice structures G' of the prior art and their related diffraction images are illustrated in FIGS. 2-7. The lattice structure G' of FIG. 2 is composed of a square which is divided into four segments by diagonals of the square. Each of these four segments comprises a diffraction lattice whose lines are oriented in a defined angular direction so that the pattern G' of FIG. 2 can supply an x-axis information as well as y-axis information. The four diffraction grids or gratings in the pattern G' of FIG. 2 respectively comprise the same grid spacing.

Figure 3:
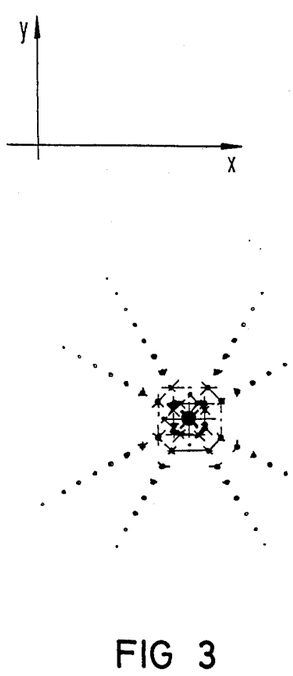
FIG. 3 illustrating the diffraction image belonging to FIG. 2.

The diffraction image of FIG. 3 is obtained from the grating of FIG. 2 when no mask M is present in the apparatus of FIG. 1 and when, therefore, the light rays R can impinge on the entire lattice structure completely freely and uninfluenced by an adjustment mark J and are diffracted at the lattice structure G'. Given a light ray R centrally impinging on the pattern of FIG. 2, each of the four diffraction gratings or grids of FIG. 2 supply two respective intensity maximums symmetrically arranged relative to the center of the pattern of FIG. 2 and supply these for each of the diffraction orders. The generation of the diffraction images of FIG. 3 with the assistance of the light ray R represents a Fourier transformation of the pattern of FIG. 2.

Figure 4:
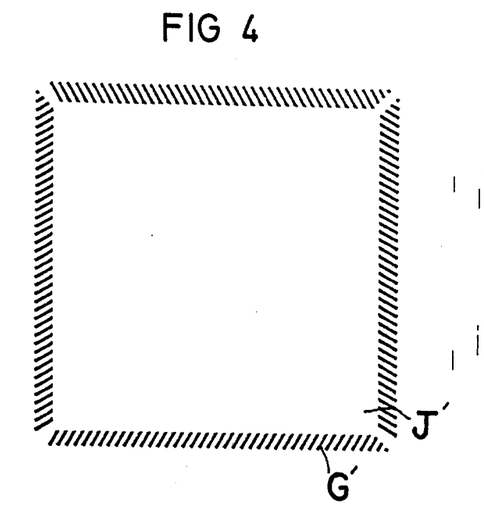
FIG. 4 illustrating a lattice structure covered by the mark of the mask in a centered position.
Figure 5:
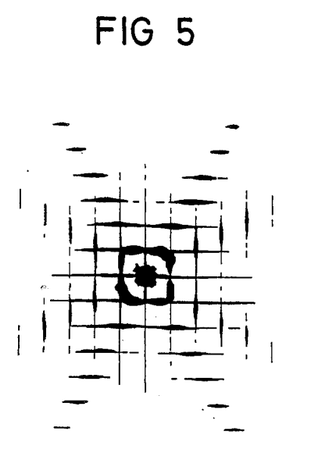
FIG. 5 illustrating the diffraction pattern from the covered lattice structure of FIG. 4.

When a lattice structure G' which is fashioned as a pattern of FIG. 2 is in the apparatus of FIG. 1 and is covered centrally by a square adjustment mark J' which is opaque to the light rays, the centrally covered portion will not receive the light rays R. Then, a lattice structure, such as illustrated in FIG. 4, will be obtained and the light rays will be diffracted only at the exposed periphery of the structure G'. The diffracted image from the arrangement of FIG. 4 is illustrated in FIG. 5 and the intensity distribution which occurs from the four lattices of the pattern G' of FIG. 4 are distributed with equal weight. Since each of the four gratings of the pattern G' of FIG. 2 represent a possible misadjustment in the directions up, down, right, left, or, respectively, positive or negative y-axis and negative or positive x-axis, the equally weighted distribution of the intensities occurring from the four gratings of the four portions mean that the quadratic adjustment mark of the prior art is centrally adjusted relative to the pattern of FIG. 4.

Figure 6:
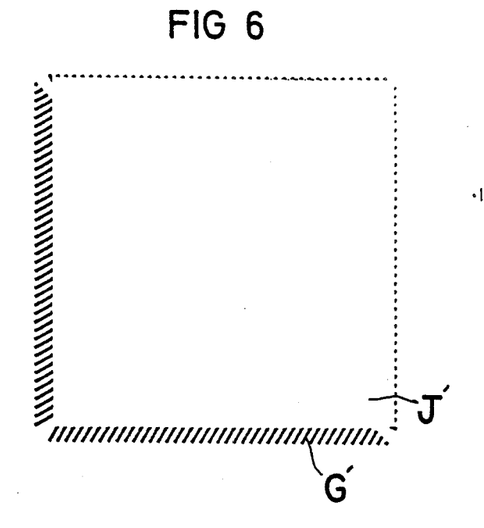
FIG. 6 showing a lattice structure with the misalignment between the mark and the lattice structure.
Figure 7:
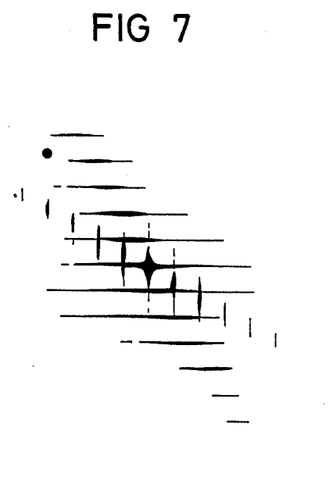
FIG. 7 showing the diffraction images belonging to the arrangement of FIG. 6.

When the pattern G' of the prior art is covered by a square adjustment mark J' which is not centrally arranged as illustrated in FIG. 6, certain of the four distinct gratings of the pattern G' will have a greater portion exposed to the light rays R.

The diffraction image produced by the arrangement of FIG. 6 will have the intensities produced from the lower and left diffraction gratings being dominant. Since practically only points are remaining from the upper and the right diffraction gratings, these points are represented by strokes in the diffraction image of FIG. 7 after the Fourier transformation. In the diffracted images of FIG. 7, these lines lead to a cross-talk of intensities which occur from different diffraction gratings in the covered pattern of FIG. 6. A discrimination between left and right, up and down is thereby made more difficult.

When the outside dimensions of the pattern G' of FIG. 2 are selected significantly greater than the outside dimensions of an appertaining square adjustment mark J' of the prior art, then the risks that only points will remain from a covered diffraction grating is, in fact, diminished. Respectively broad edges of each of the four gratings remain with great probability for the four directions even with a covered pattern. These broad edges, however, have the disadvantage that only small relative changes in the respective appertaining diffraction images occur given small dislocations of the adjustment mark relative to the pattern of FIG. 2.

Figure 8:
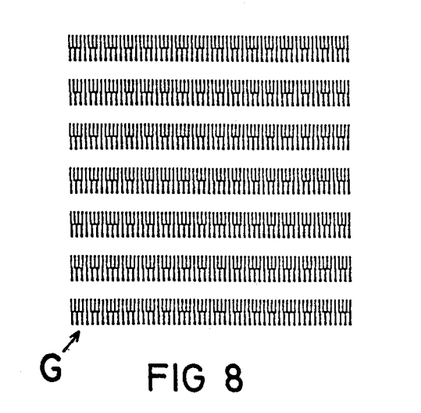

The lattice structure G of the present invention is illustrated in FIG. 8. A lattice structure of FIG. 8 is composed of two groups of seven gratings wherein each grating comprises an elongated strip with two sub-gratings with different grid spacings. An adjustment mark J of the invention is fashioned as an elongated strip for each grating such that in the adjusted case, the mark J completely covers the gratings of the lattice structure G of FIG. 8 when the light ray R is switched on. The multiplication of the numbered of gratings in the lattice structure G of FIG. 8 in comparison to the lattice structure G' of FIG. 2 yields a multiplication of the intensity of the light points in the diffractive image illustrated in FIG. 9 which belongs to the lattice structure G of FIG. 8. Given a misadjustment of the mask M relative to the wafer W in one of the directions, whether it is up or down; or left or right, a plurality of uncovered covering edges or strips AK take effect for the direction in which misalignment or misadjustment has occurred. These uncovered edges AK occur when the adjusted mark J does not completely occlude the lattice structure G in the misadjusted case. The gratings of the lattice structure of FIG. 8 are then only partially covered. An edge AK proceeds where the occlusion of the grating of the lattice structure G of FIG. 8 due to the coverage by the adjustment mark J ends. Each of the gratings of the two groups of strips of the lattice structure G comprise two sub-gratings with different grid spacings. Since given a misadjustment of the mask M relative to the wafer W, the light diffracted at the sub-gratings which exhibit different grating spacings exhibit different intensities for different grid spacings in the diffraction image whether misalignment towards the top or towards the bottom or, respectively, towards the right or towards the left is present so that the direction and amount of misalignment can be easily distinguished.

The sub-gratings, which have different grating spacings for each lattice, supply information concerning a possible misalignment in the opposite direction. Since these sub-gratings, which supply information concerning a possible misalignment in opposite directions, lie in close proximity next to one another, lacquer influences and proximity influences are kept small.

Instead of seven strip-like gratings for each spatial dimension, a different number of gratings can also be selected. Further, three or four different grating spacings can be selected instead of only two different grating spacings. The grid fingers for each grating likewise need not necessarily be fashioned to extend perpendicular to the longitudinal axis of the strip-like grating. The grid fingers can, respectively, form an angle with a longitudinal axis of the strip-like grating for each direction in which a misalignment can be undertaken. What is important is that the strip-like gratings have a defined structure that is multiply present in the lattice structure G in order to multiply the intensity. The lattice arrangement for the direction information whether it is left or right can be shaped differently than the lattice arrangement for the direction information up and down.

Figure 10:
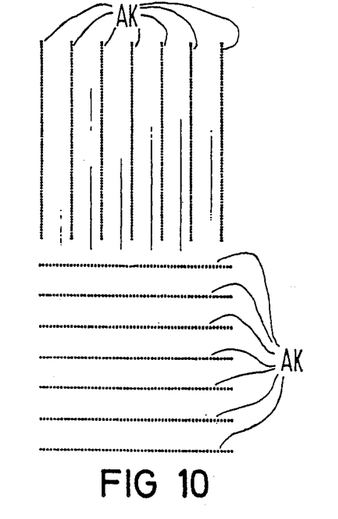
FIG. 10 showing the lattice structure of the present invention covered by a misaligned adjustment mark.

In FIG. 10, a pattern of FIG. 8 which is covered by an adjustment mark of the invention in a misadjusted fashion. The uncovered edges AK are thereby arranged such that only one sub-grating having a single constant grid spacing is, respectively, still effective for the diffraction image in every spatial dimension. A diffraction image illustrated in FIG. 11 will be obtained for this arrangement.

Figure 12:
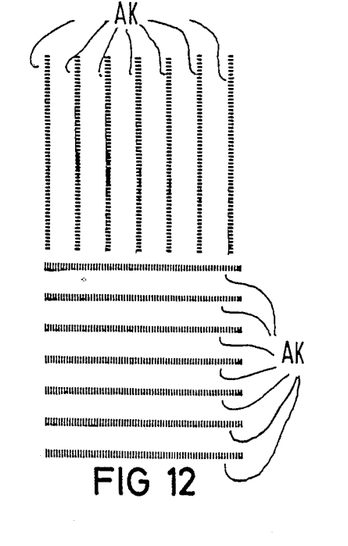
FIG. 12 being a lattice structure in accordance with the present invention covered by an adjustment mark arranged so only misaligned with the adjustment mark in only one direction.

If a lattice structure G of FIG. 8 is now covered by an adjustment mark J of the invention, the uncovered edges AK lie such that only, respectively, one sub-grating having a single constant grid spacing will occur. With this occurring, the misalignment such that precisely those sub-gratings not effected give the arrangement of FIG. 10 are effectively given the arrangement of FIG. 12. As illustrated, the diffraction image belonging to the arrangement of FIG. 12 is shown in FIG. 13.

Figure 11:
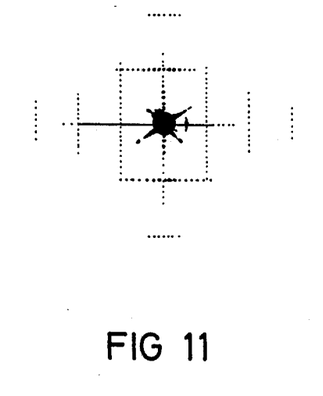
FIG. 11 being the diffraction pattern of the covered structure of FIG. 10.
Figure 13:
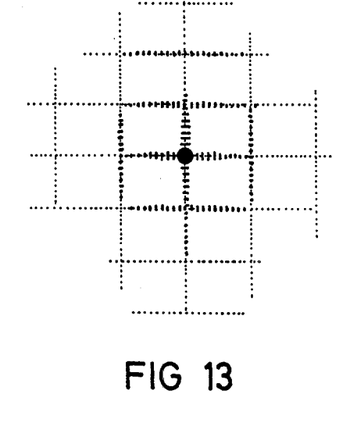
FIG. 13 being a diffraction image belonging to the arrangement of FIG. 12.

A comparison of the diffraction images of FIG. 11 and of FIG. 13 clearly show that a cross-talk from various directions in which misalignment can be carried out is impossible given an apparatus of the invention and those directions in which a misalignment is present can be immediately specified.

A lattice structure G can be manufactured in the semi-conductor wafer W in various ways. The diffraction lines can be defined in a photo resist layer, in an oxide layer, in a semi-conductor layer, or in a metal layer. The only thing that is important is that the lattice structure G be fashioned on or in the semi-conductor wafer W so that given illumination with the assistance of a light ray R, it supplies adequate light intensities into the detector arrangement D in order to produce a diffraction image.

When two lattice structures G and two adjustment marks J are adjusted above one another in the specific way, the adjustment of the mask M relative to the wafer W can occur both by means of translation as well as by means of rotation of the mask M and the wafer W relative to one another.

In the adjusted case, the adjustment mark J need not necessarily occlude or cover the gratings of the lattice structure G. What is important is that a position of the adjustment mark J relative to the grating structure G is defined for the adjusted case and that the adjustment mark J comprise at least as many edges K equal in number to the edges AK which should become active given a possible misadjustment of the mask M relative to the wafer W.

Figure 9:
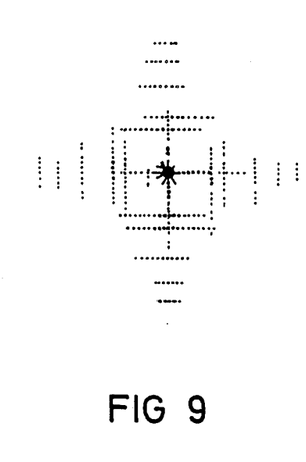
FIG. 9 showing the diffraction image from the lattice structure of FIG. 8.

The adjusted case can also be defined so that given the coverage of the lattice structure G by the adjustment mark J, the uncovered edges AK thereby occur and lie, for example, at the edge of the strip-like grating of the lattice structure G so that a diffraction image of FIG. 9 is present in this example for the adjusted case. Given the covering method, the diffraction area component of the lattice G is modified by positional changes of the adjustment mark J.

The prior art lattice arrangement illustrated in FIG. 2 cannot be employed for precision below 0.1 $\mu$m because the measured signal changes for shifts of about 0.1 $\mu$m are smaller than those caused by fluctuations in the lacquer or in the proximity spacing.

Given the lattices of FIGS. 2, 4 and 6, only a narrow edge zone of the lattice amounting to 10 percent of the lattice area is used during the adjustment. In addition, the diffraction intensity of the narrow grating does not collect in diffraction points as in the case of a row of points but is smeared in strokes.

Given the apparatus or adjustment grating of FIG. 8, the grating webs or lines are preferably aligned perpendicular to the uncovered edges AK so that no shading of the reflections occur given a small grating constant and given a great proximity distance.

Given an apparatus of FIG. 8, the splitting into plus and minus directions with respect to the x-axis or, respectively, to the y-axis occurs by means of the two different grid constants or spacings. The x-fields and the y-fields are combined in different regions of the lattice G.

The stop structure or adjustment mark J in the mask M is composed of strips which advantageously cover the individual strip-like gratings of the lattice structure G in the adjusted position.

The following advantages over the prior art can be expected with the adjustment structures of FIGS. 8, 10 and 12. A plurality of covering edges are exploited for every coordinate axis and this will create an intensity boost in accordance with the diffraction surface. The periodicity of the grating strips, given small deviations from the rated position in which the strips of the adjustment mark J cover the grating of the lattice structure G will lead to "cross-point grating" whose diffraction intensities are not collected in strokes but in maxima. A further intensity boost will occur therefrom. Finally, positive and negative direction gratings lie in close proximity next to one another so that the lacquer influences and proximity influences are kept small.

Although various minor modifications may be suggested by those versed in the art, it should be understood that I wish to embody with the scope of the patent granted hereon, all such modifications as reasonably and properly come within the scope of my contribution to the art.

I claim:

1. In an apparatus for adjusting a mask relative to a semi-conductor wafer, said wafer being provided with at least one lattice structure, said mask being provided with at least one adjusting mark, each of said lattice structures comprising diffraction gratings having different grid directions, said apparatus including means for imaging an adjustment mark of the mask onto a lattice structure by projecting light at the structure, and means for receiving a diffracted light patterns from the structure, the improvements comprising at least one of said lattice structures comprising at least two gratings having different grid directions, each of said gratings having at least two sub-gratings with different grid spacings to discriminate misalignment in opposite directions, said adjustment mark having at least one portion for each of the gratings provided with two opposite edges so that misalignment in each of the opposite directions presents uncovered parts of sub-gratings with different grid spacings for each direction respectively.

2. In an apparatus according to claim 1, wherein the sub-grating which serves for discrimination of the misalignment in opposite directions lie closely approximate to one another.

3. In an apparatus according to claim 2, wherein the means for imaging of the adjustment marks onto each of the lattice structures is a 1:1 shadow imaging.

4. In an apparatus according to claim 2, wherein the means for imaging of the adjustment mark onto the lattice structure is a demagnified imaging.

5. In an apparatus according to claim 1, wherein the means for imaging of adjustment mark onto the lattice structure is a 1:1 shadow imaging.

6. In an apparatus according to claim 1, wherein the means for imaging of the adjustment mark onto the lattice structure is a demagnifying image.

7. In an apparatus according to claim 1, wherein the lattice structure includes a plurality of parallel elongated strips arranged in two groups with the strips in one group forming one grating and being at an angle to the strips in the other group which forms the other grating, each of said adjustment marks having strip portions coinciding with the strips of the two groups so that when alignment occurs, the adjustment marks substantially overlie the lattice structure to prevent light from the means for imaging from striking the lattice structure.

8. In an apparatus according to claim 7, wherein each of the strips of each group is sub-divided into two portions extending side by side with one portion being one sub-grating with one grid spacing and being on one side of each strip and the other portion being the other sub-grating with the other grid spacing and being on the opposite side of each strip.

* * * * *